United States Patent
Yu et al.

(10) Patent No.: US 9,482,965 B2
(45) Date of Patent: Nov. 1, 2016

(54) TRANSMISSION BALANCING FOR PHASE SHIFT MASK WITH A TRIM MASK

(71) Applicant: SEAGATE TECHNOLOGY LLC, Cupertino, CA (US)

(72) Inventors: Dan Yu, Shakopee, MN (US); Aaron Bowser, St. Paul, MN (US); Yi Liu, Edina, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/144,368

(22) Filed: May 2, 2016

(65) Prior Publication Data

US 2016/0246183 A1    Aug. 25, 2016

Related U.S. Application Data

(62) Division of application No. 14/528,174, filed on Oct. 30, 2014, now Pat. No. 9,341,939.

(51) Int. Cl.
| | |
|---|---|
| *G03F 1/30* | (2012.01) |
| *G03F 1/50* | (2012.01) |
| *G03F 7/20* | (2006.01) |
| *G03F 9/00* | (2006.01) |

(52) U.S. Cl.
CPC ............. *G03F 7/70633* (2013.01); *G03F 1/30* (2013.01); *G03F 7/20* (2013.01); *G03F 7/70558* (2013.01); *G03F 7/70625* (2013.01); *G03F 9/7007* (2013.01)

(58) Field of Classification Search
CPC ............. G03F 1/30; G03F 1/50; G03F 7/20; G03F 7/70625; G03F 7/70633; G03F 7/70558; G03F 9/7007
USPC ................................................ 430/5, 22, 30
See application file for complete search history.

(56) References Cited

U.S. PATENT DOCUMENTS

| | | | |
|---|---|---|---|
| 6,458,495 | B1 | 10/2002 | Tsai et al. |
| 6,818,389 | B2 | 11/2004 | Fritze et al. |
| 6,884,551 | B2 | 4/2005 | Fritze et al. |
| 7,282,306 | B2 | 10/2007 | Vernon et al. |
| 7,306,881 | B2 | 12/2007 | Fritze et al. |
| 7,651,821 | B2 | 1/2010 | Tyrrell et al. |
| 7,695,872 | B2 | 4/2010 | Vernon et al. |
| 7,735,056 | B2 | 6/2010 | Aton et al. |
| 7,794,921 | B2 | 9/2010 | Chen et al. |
| 7,818,711 | B2 | 10/2010 | Aton |
| 7,906,253 | B2 | 3/2011 | Aton et al. |
| 7,906,271 | B2 | 3/2011 | Aton |
| 7,968,277 | B2 | 6/2011 | Chen et al. |
| 7,984,393 | B2 | 7/2011 | Aton et al. |
| 7,993,815 | B2 | 8/2011 | Colburn et al. |
| 8,415,089 | B1 | 4/2013 | Gupta et al. |
| 2003/0165749 | A1 | 9/2003 | Fritze et al. |
| 2004/0259042 | A1 | 12/2004 | Fritze et al. |
| 2005/0112476 | A1 | 5/2005 | Bellman et al. |
| 2005/0214652 | A1 | 9/2005 | Vernon et al. |
| 2005/0238965 | A1 | 10/2005 | Tyrrell et al. |
| 2007/0231711 | A1 | 10/2007 | Aton et al. |
| 2008/0044768 | A1 | 2/2008 | Vernon et al. |
| 2009/0004573 | A1 | 1/2009 | Aton |
| 2009/0065956 | A1 | 3/2009 | Colburn et al. |
| 2009/0068837 | A1 | 3/2009 | Colburn et al. |
| 2009/0087619 | A1 | 4/2009 | Aton et al. |
| 2009/0087754 | A1 | 4/2009 | Aton |
| 2009/0125870 | A1 | 5/2009 | Aton et al. |
| 2009/0128788 | A1 | 5/2009 | Aton |

FOREIGN PATENT DOCUMENTS

WO    02-03138    1/2002

*Primary Examiner* — Christopher Young
(74) *Attorney, Agent, or Firm* — HolzerIPLaw, PC

(57) ABSTRACT

Implementations described and claimed herein include photolithography technology to alleviate the imbalance of transmission intensity induced. In one implementation, a method comprises exposing an alternating phase shift mask (Alt-PSM) and a trim mask, wherein an exposure placement of the trim mask is shifted relative to an exposure placement of the Alt-PSM.

20 Claims, 9 Drawing Sheets

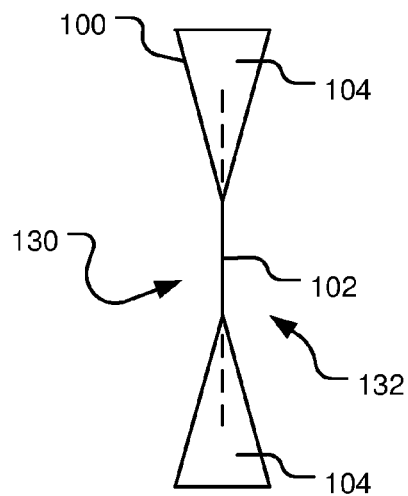
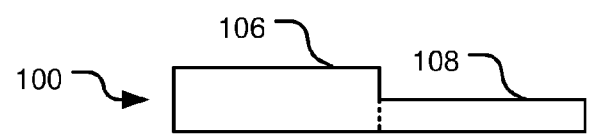
FIG. 1B
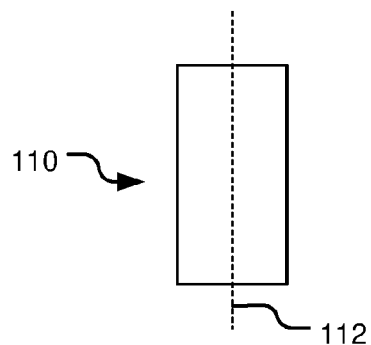
FIG. 1C
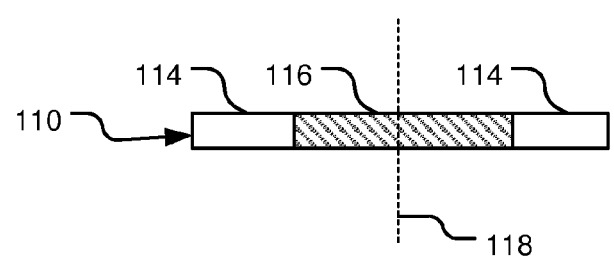
FIG. 1D
FIG. 1A

TRANSMISSION BALANCING FOR PHASE SHIFT MASK WITH A TRIM MASK

CROSS-REFERENCE TO RELATED APPLICATION

The present application is a divisional application of U.S. patent application Ser. No. 14/528,174, filed Oct. 30, 2014, and titled "Transmission Balancing For Phase Shift Mask With A Trim Mask", and expected to issue on May 17, 2016 as U.S. Pat. No. 9,341,939, which is hereby incorporated by reference in its entirety.

BACKGROUND

Photolithography is a process used in fabrication of nanoscale components (e.g., electrical circuits, optical components) that are generally made of thin films layered on a substrate. This process involves depositing thin film layer(s) on a substrate, forming geometric pattern formed with a layer of photoresist material, and then selectively removing parts of a thin film (or the substrate itself) based on the geometric pattern.

During the photolithography process, electromagnetic energy (e.g., light) is transmitted through a photomask or reticle to expose parts of the photoresist layer in the desired pattern. The exposed photoresist can be subjected to a chemical treatment (e.g., "developing") that removes areas of photoresist that were exposed to the light. In other cases, areas receiving no light exposure may instead be removed by a developer. In either case, the resulting surface has a pattern formed by the developed photoresist, and the surface can then be further treated. For example, etching may be performed so that exposed areas of the surface are etched away, while those areas covered by the photoresist are unaffected.

Photolithography is commonly associated with the manufacture of an integrated electronic circuit. Photolithography can also be used in making integrated optics, which includes optical components (e.g., lasers, waveguides, lenses, mirrors, collimators, etc.) that are formed on a substrate in a manner analogous to integrated electrical circuits. Photolithography is also used in manufacturing recording head components for data storage devices.

SUMMARY

Implementations described and claimed herein include photolithography patterning technology to alleviate the imbalance of transmission intensity induced by the alternating phase shift mask exposure in magnetic reader device formation. In one implementation, a method comprises exposing an alternating phase shift mask (Alt-PSM) and a trim mask, wherein an exposure placement of the trim mask is shifted relative to an exposure placement of the Alt-PSM.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

FIGS. 1A-1D illustrate example mask geometries of an Alt-PSM mask and a trim mask with top down and cross-sectional views.

DETAILED DESCRIPTIONS

Figure 2:
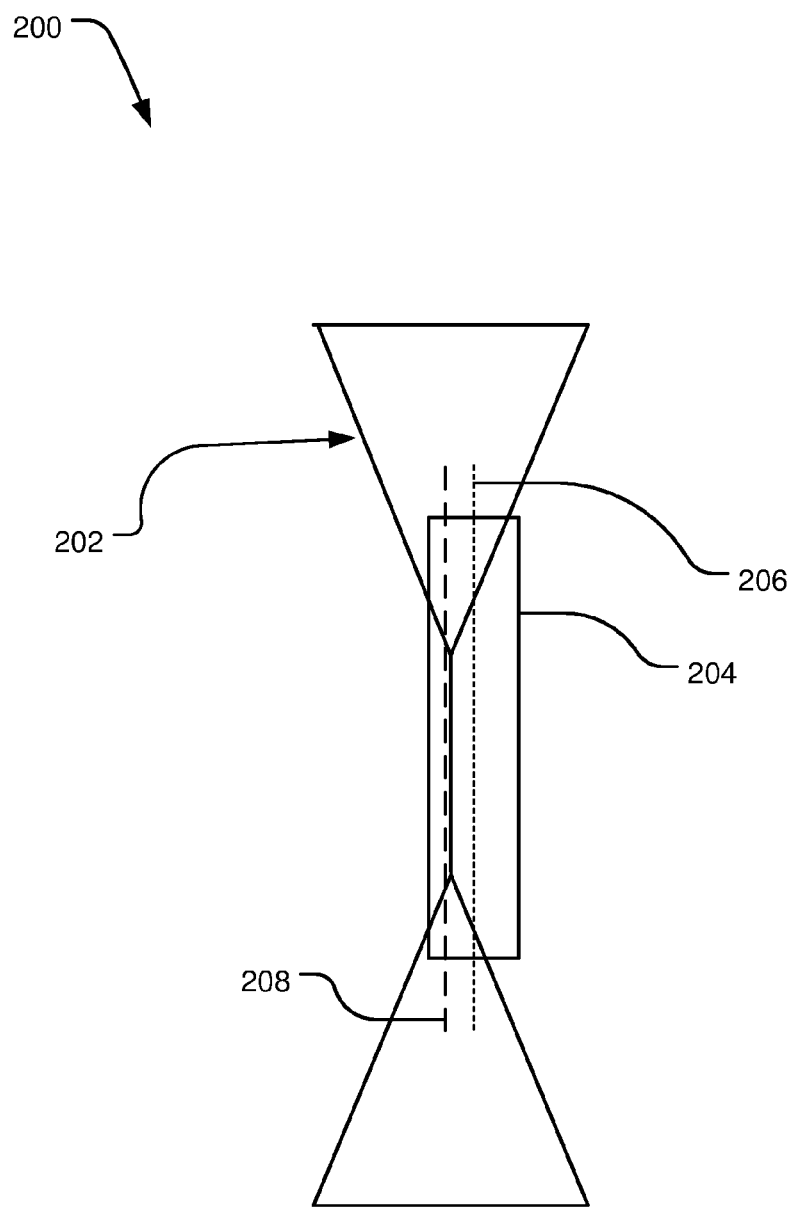
FIG. 2 illustrates an example computer aided design image of an exposure placement of a trim mask relative to an exposure placement of the Alt-PSM.
Figure 2:
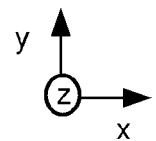

An ongoing desire to make more densely packed integrated devices has necessitated changes to the photolithography process to form smaller individual feature sizes, often referred to by the term "minimum feature size" or "critical dimension" (CD). The CD is determined approximated by the formula $CD=k_1 * \lambda / NA$, where $k_1$ is a process-specific coefficient, $\lambda$ is the wavelength of applied light/energy, and NA is the numerical aperture of the optical lens as seen from the wafer. This formula may be applicable to both dense features and isolated features for resolution purposes.

For fabrication of dense features with a given value of $k_1$, the ability to project a usable image of a small feature onto a wafer is limited by the wavelength $\lambda$ and the ability of the projection optics to capture enough diffraction orders from an illuminated mask. When either dense features or isolated features made from a photomask or a reticle is of a certain size and/or shape, the transitions between light and dark at the edges of the projected image may not be sharply defined enough to correctly form target photoresist patterns. This may result, among other things, in reducing the contrast of aerial images and also the quality of resulting photoresist profiles. As a result, features 150 nm or below in size may need to utilize phase shifting techniques to enhance the image quality at the wafer, e.g., sharpening edges of features to improve resist profiles.

Phase-shifting generally involves selectively changing phase of part of the energy passing through a photomask/reticle so that the phase-shifted energy is additive or subtractive with unshifted energy at the surface of the wafer. By carefully controlling the shape, location, and phase shift angle of mask features, the resulting photoresist patterns can have more precisely defined edges.

Phase shifts may be obtained in a number of ways. For example, one process known as attenuated phase shifting utilizes a layer of non-opaque material that causes light passing through the material to change in phase compared to light passing through transparent parts of the mask.

Another technique is known as alternating phase shift, where the transparent mask material (e.g., quartz) is etched to have different depths across its surface exposed to optical energy. The depths can be chosen to cause a desired relative phase difference in light passing through the different depths. Using an alternating phase shift mask (Alt-PSM), forming resist line features, provides a larger process window over that of the chrome-on-glass masks.

For one implementation, the opaque material between 0° and 180° phases can be totally removed during the mask fabrication process. This design may be referred to as "chromeless" and further improves the process window and can be used for patterning extremely narrow features. On the other hand, the intrinsic phase termination issue makes the circuit design extremely difficult. To address this, a combination of a phase shift mask and a chrome-on-glass trim mask (referred to as the "trim mask") may be used. Therefore, a double exposure technique may be utilized when an Alt-PSM is involved for process patterning.

The Alt-PSM and the trim mask are exposed by placing the Alt-PSM and the trim mask between the light source and a wafer where a photoresist pattern is desired. In order to pattern small features, an Alt-PSM can be exposed, and subsequently a trim mask is exposed to finalize a target area and remove unwanted large features. In one implementation, these two masks can be exposed with a perfect overlap of the center of the trim mask to the center of the Alt-PSM, wherein the center of the Alt-PSM is also the phase transition edge from 0° to 180° of the Alt-PSM.

As the feature size is getting smaller, the imbalance of transmission intensity due to the phase-shift mask manufacturing process results in significant CD variation and placement errors for the photoresist pattern. Manufacturing/process techniques have attempted to alleviate the imbalance issue, including the opening biasing between 0° and 180° phase portion, isotropic etching, and exposing with original and inverse phase shift masks.

As the areal density advances at a staggering pace in magnetic recording, the demand to scale down recording head dimensions continues. A photolithography-defined reader width can be as small as sub 50 nm, and phase shift mask technology may be used to achieve such fine features. These patterned structures are extremely sensitive to any mask/process induced variations. Particularly, CD placement and uniformity suffers from the transmission intensity imbalance induced from the phase shift mask exposure. Keeping up the scaling down of CD variation with the continuous reader dimension reduction is a significant challenge.

The technology disclosed herein involves a photolithography method to eliminate the transmission intensity issue by shifting/modulating an exposure placement of a trim mask relative to an exposure placement of an Alt-PSM. By modulating the trim mask exposure, the imbalance of transmission intensity induced by the Alt-PSM exposure is alleviated, the transmission intensity can be symmetrical on the left and right resist edges, and have less wafer-to-wafer (wTw) CD variation (e.g., as much as 15%).

FIGS. 1A-1D illustrate the mask geometries of an Alt-PSM mask and a trim mask with top down and cross-sectional views. FIG. 1A shows a top down view of an Alt-PSM 100. The Alt-PSM 100 in the implementation in 1A has a phase width along the x-axis (along width of FIG. 1A) of approximately 2 um, and the height along the y-axis (along height of FIG. 1A) of approximately 700 nm. The numeral 102 of Alt-PSM 100 is the phase transition edge from phase 0° to 180°. For example, a region 130 to the left of the phase transition edge 102 may represent a phase 180°, whereas a region 132 to the right of the phase transition edge 102 may represent a phase 0°. The chrome area 104 of Alt-PSM has zero transmission. Other implementations of the Alt-PSM may vary in size.

FIG. 1B illustrates a cross-sectional view of the Alt-PSM 100. The Alt-PSM 100 can contain areas where there is 100% light transmission (or 0° and 180° phase areas). For example, there may be areas in the Alt-PSM 100 where quartz has been etched away in the photolithography process leaving varying thicknesses (see area 108 in Alt-PSM 100) as shown in FIG. 1B. The optical path can be different in area 108 as compared to other areas of the Alt-PSM of different thickness (e.g., area 106), such as where the quartz has not been etched away. The effect of the difference in the optical path results in a phase shift. The image transferred onto a wafer can have high intensity in most areas, and then at the edge where the phase shift occurs, from area 106 to area 108, the light intensity drops and there is a phase shift. Depending on the thickness difference of two phases of the Alt-PSM 100, there may be significantly less light transmission at a phase transition area.

FIG. 1C illustrates a top down view of a trim mask 110. As provided above, the Alt-PSM 100 and trim mask 110 can be exposed with an overlap of the trim mask 110 to the Alt-PSM 100. The numeral 112 of a trim mask 110 indicates the center position of the trim mask 110.

FIG. 1D illustrates a cross-sectional view of the trim mask 110. As shown in FIG. 1D, the trim mask 110 has chrome area 116, around a center position 118 of the mask. The edges of the trim mask 110 include non-chrome areas 114. The trim mask 110 can be positioned to overlap an Alt-PSM.

FIG. 2 illustrates an example computer aided design (CAD) image 200 of an exposure placement of a trim mask 204 relative to an exposure placement of a chromeless mask Alt-PSM 202. Synopsis lithography simulation software can be used to model the aerial images generated by the Alt-PSM 202 and the trim mask 204.

The example CAD image 200 in FIG. 2 shows exposure placement of a trim mask 204 relative to an exposure placement of the Alt-PSM 202. Specifically, in FIG. 2 the Alt-PSM 202 and the trim mask 204 are positioned along the z-axis between a light source (not shown) and a wafer (not shown). The trim mask 204 used in the disclosed technology has a width (along x-axis) of less than 500 nm. The modulation of transmission from the trim mask edges is inversely proportional to the CAD size. The process integration for the following processes, such as dry etch mill or chemical mechanical polish, needs to be considered for the trim mask width. The trim mask 204 in this implementation can have a size set at approximately 200 nm×4000 nm, with the width along the x-axis of 200 nm and the height along the y-axis of 4000 nm. The center of the trim mask 204 (trim mask center 206) along the x-axis is shifted compared to the phase transition edge 208 of the Alt-PSM 202. In one implementation, the phase transition edge 208 represents the center of the Alt-PSM 202 along the x-axis.

The weighted aerial image of Alt-PSM 202 and trim mask 204 can be constructed through the dose ratios between these two masks. The weighted aerial image generated by the combination of the masks is studied as a metric for transmission intensity symmetry. The trim mask 204 relative to the Alt-PSM 202 can be swept from approximately −12 nm to approximately 12 nm, as shown in FIG. 4.

Figure 3:
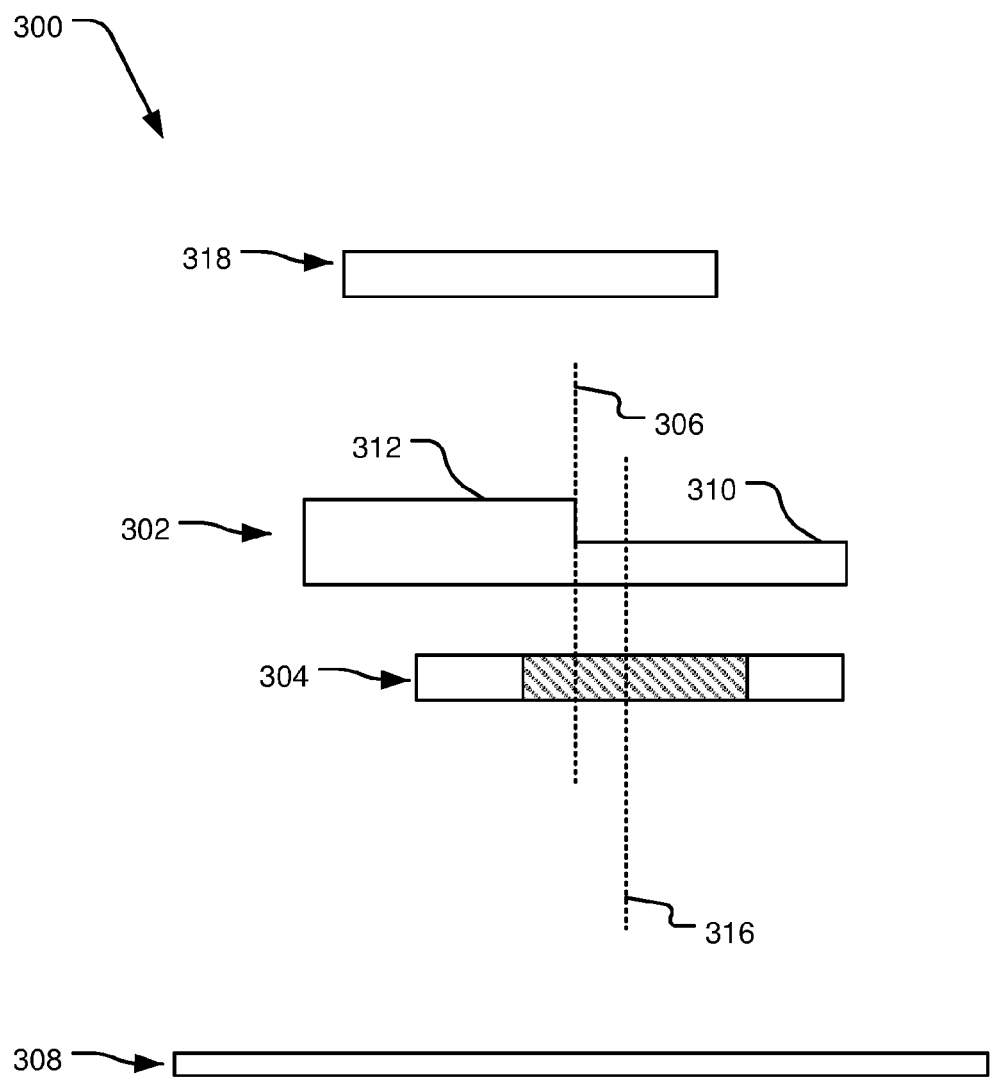
FIG. 3 illustrates an example side view of exposure placement of a trim mask relative to an exposure placement of an Alt-PSM.

FIG. 3 illustrates a side view 300 of exposure placement of a trim mask 304 relative to an exposure placement of an Alt-PSM 302 below an optical energy source 318 and above a wafer 308 with one or more layers. The Alt-PSM 302 in the implementation in FIG. 3 has areas 310 and 312 with varying light transmission due to the differences in thickness (along a z-axis). An image transferred on the wafer 308 through the area 312 can have high intensity, and then at a phase transition edge 306, wherein the thickness of an Alt-PSM 302 changes (from thicker area 310 to thinner area 312), there is a phase shift. The center (along the y-direction) of the trim mask 304 (trim mask center 316) is shifted as compared to the phase transition edge 306 of the Alt-PSM 302. In other words, the trim mask center 316 does not overlap the phase transition edge 306 of the Alt-PSM.

Simulated results may be generated for the weighted aerial images for different displacements of the center 316 of the trim mask 304 relative to the phase transition edge 306 of an Alt-PSM 302. The relative shifting of the center 316 of the trim mask 304 relative to the phase transition edge 306 of the Alt-PSM 302 eliminates the transmission intensity imbalance resulting from the use of the Alt-PSM 302. In the illustrated implementation, the center 316 of the trim mask 304 is shifted towards the thinner section of the Alt-PSM 302 along the y-axis. In one implementation, the center 316 of the trim mask 304 may be shifted away from the phase transition edge 306 of the Alt-PSM 302. For example, in one implementation, the center 316 of the Trim mask 304 may be shifted away from the phase transition edge 306 of the Alt-PSM 302 by approximately 8 nm.

Figure 4:
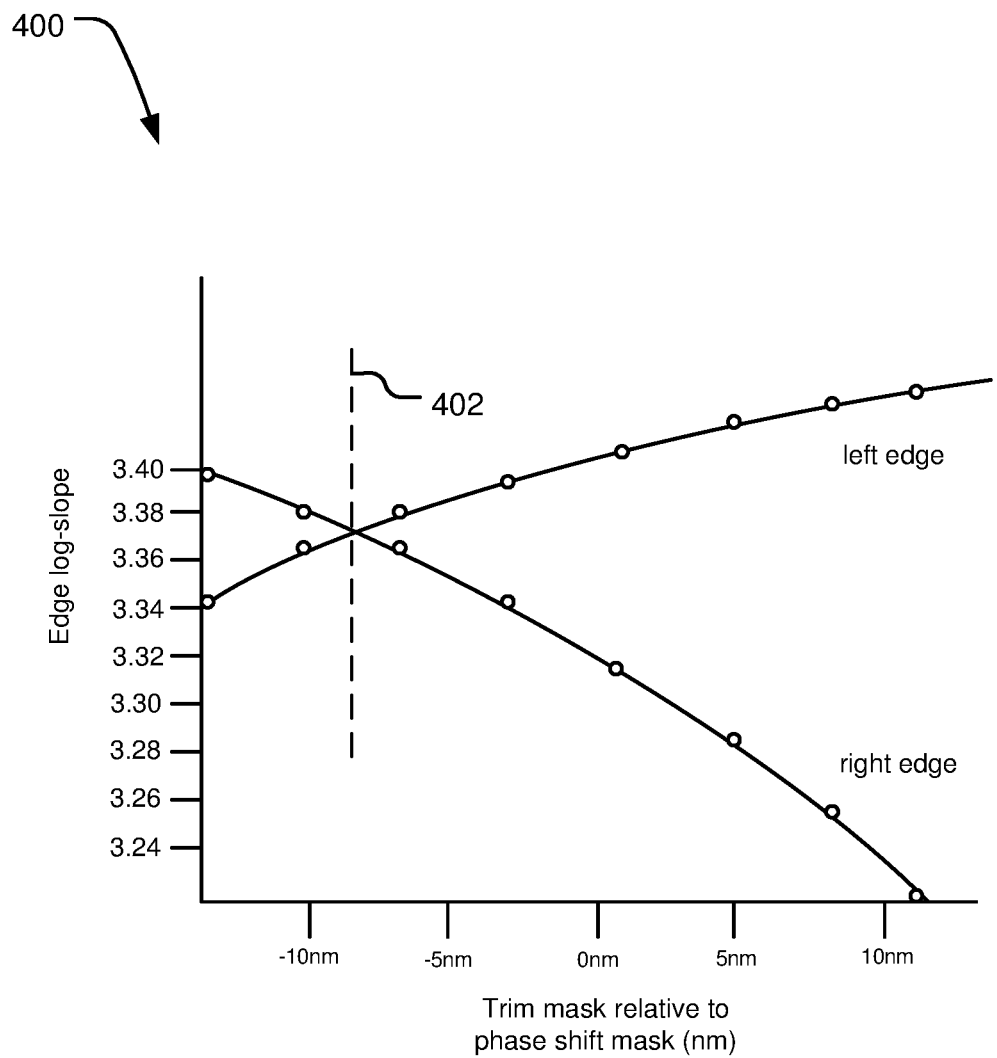
FIG. 4 shows an example graph of log slopes from left and right edges of a weighted aerial image for displacement of a trim mask relative to an Alt-PSM.

FIG. 4 shows an example graph 400 of log slopes from left and right edges of the weighted aerial image for displacement of a trim mask relative to an Alt-PSM. The negative shift indicates that the center of the trim mask is within the 180° phase region of the Alt-PSM. Asymmetry of transmission intensity from both edges can be observed for the perfect center overlap of Alt-PSM and trim mask. Examples of log slope from left and right edges of these aerial images are shown in a graph of FIG. 4, which is plotted against the displacement distance of trim mask relative to the Alt-PSM (in nm).

The left and right log slopes show opposite trends when the displacement moves from −12 nm to 12 nm. In one implementation, these two trends intercept at a condition when the center of the trim mask is approximately at −8 nm from the Alt-PSM phase transition edge, illustrated by the interception 402 in FIG. 4. The aerial image of this implementation for an approximately −8 nm shift shows the best symmetry from all the aerial images, indicating the balanced transmission condition.

Figure 5:
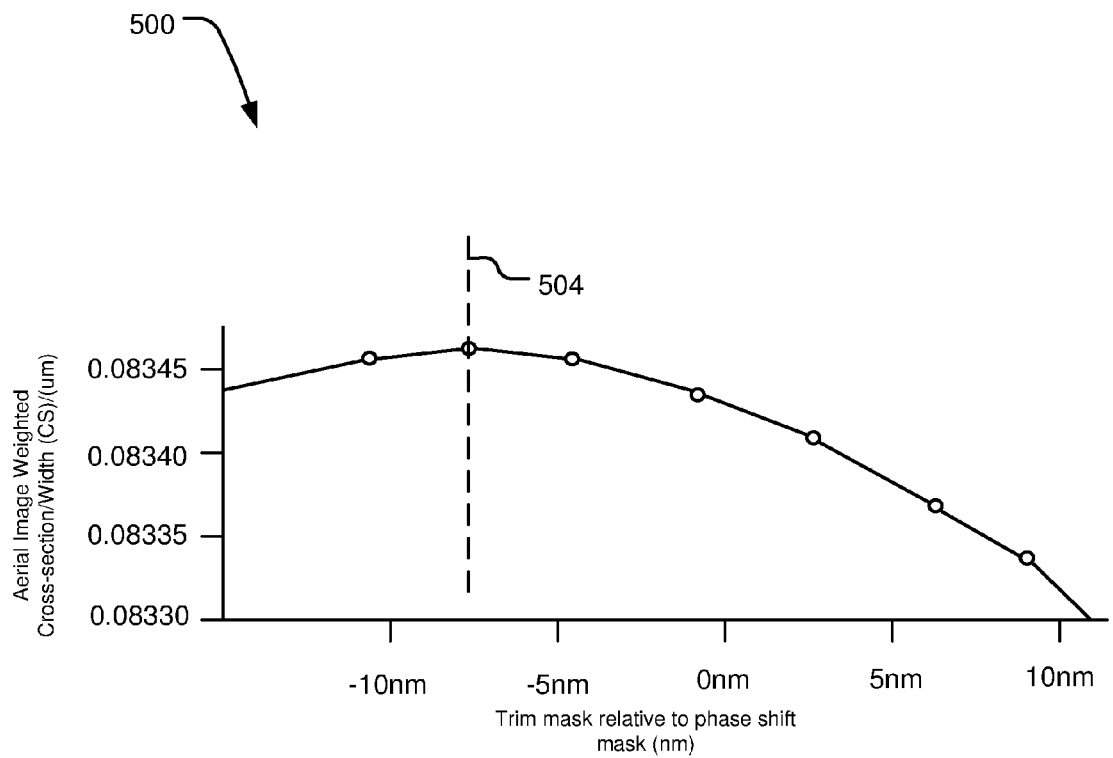
FIG. 5 illustrates an example plot of critical dimension (CD) from weighted aerial images vs. trim mask to Alt-PSM displacement.

FIG. 5 illustrates an example plot 500 of CD data (cross-section (CS)/width (μm)) from the weighted aerial images) vs. a trim mask to Alt-PSM displacement (in nm). The parabolic shape in FIG. 5 shows the CD response when the trim mask is shifted relative to the Alt-PSM. The results in this example plot 500 reveal that there is maximum CD when the trim mask position relative to Alt-PSM is approximately −8 nm, as illustrated by 504.

Figure 6:
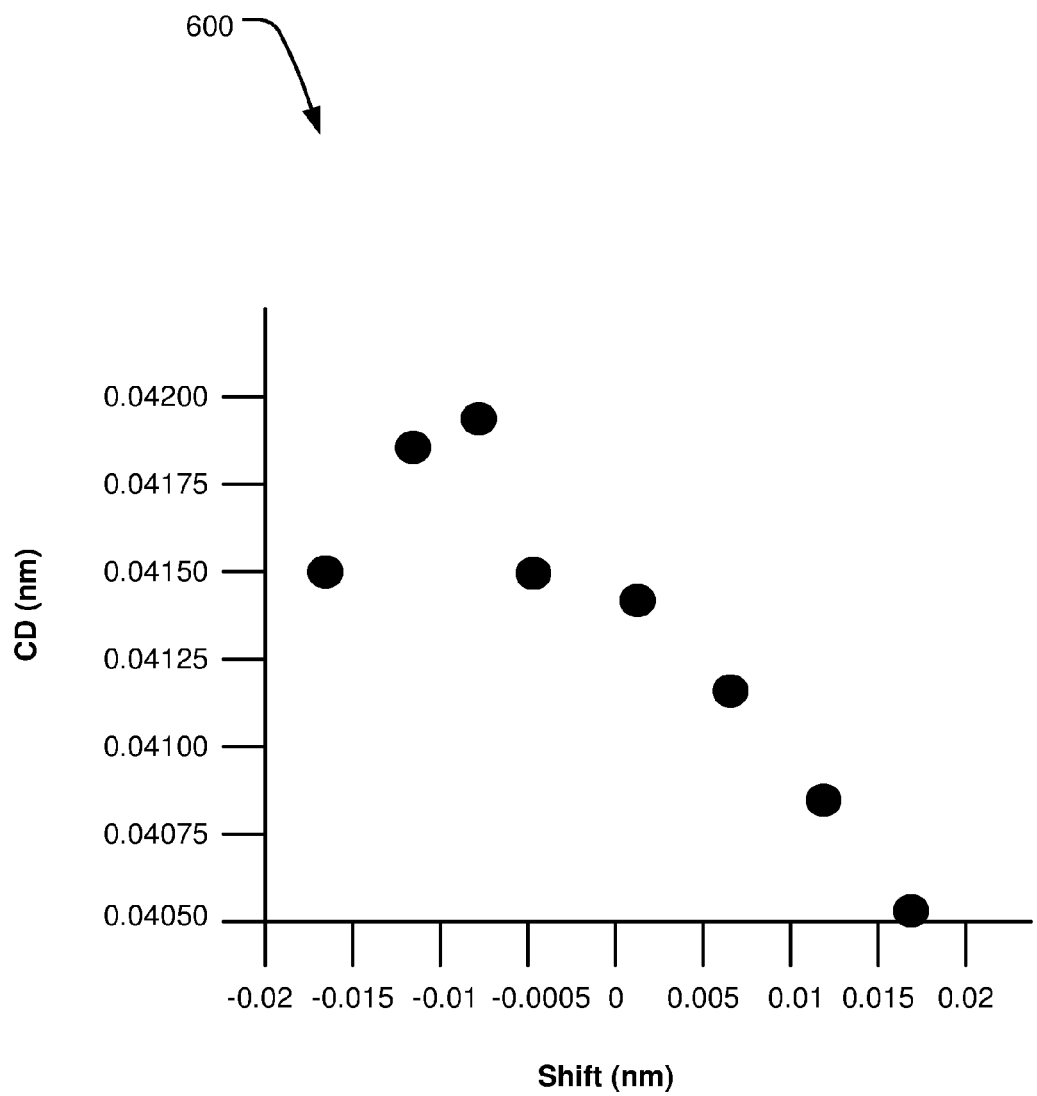
FIG. 6 illustrates an example graph of simulated photoresist bottom CD as a function of relative displacement.

FIG. 6 discloses further simulation results with a calibrated photoresist model. The graph 600 is simulated resist CD as a function of the relative displacement of a trim mask to an Alt-PSM mask. A similar trend is observed as in FIGS. 4 and 5, and an optimum displacement of a trim mask to an Alt-PSM mask exists. The optimum displacement is a function of process condition, especially of trim mask CAD size and dose ratio between Alt-PSM and trim mask. Typically, the shift can be numerically determined through simulation.

Figure 7:
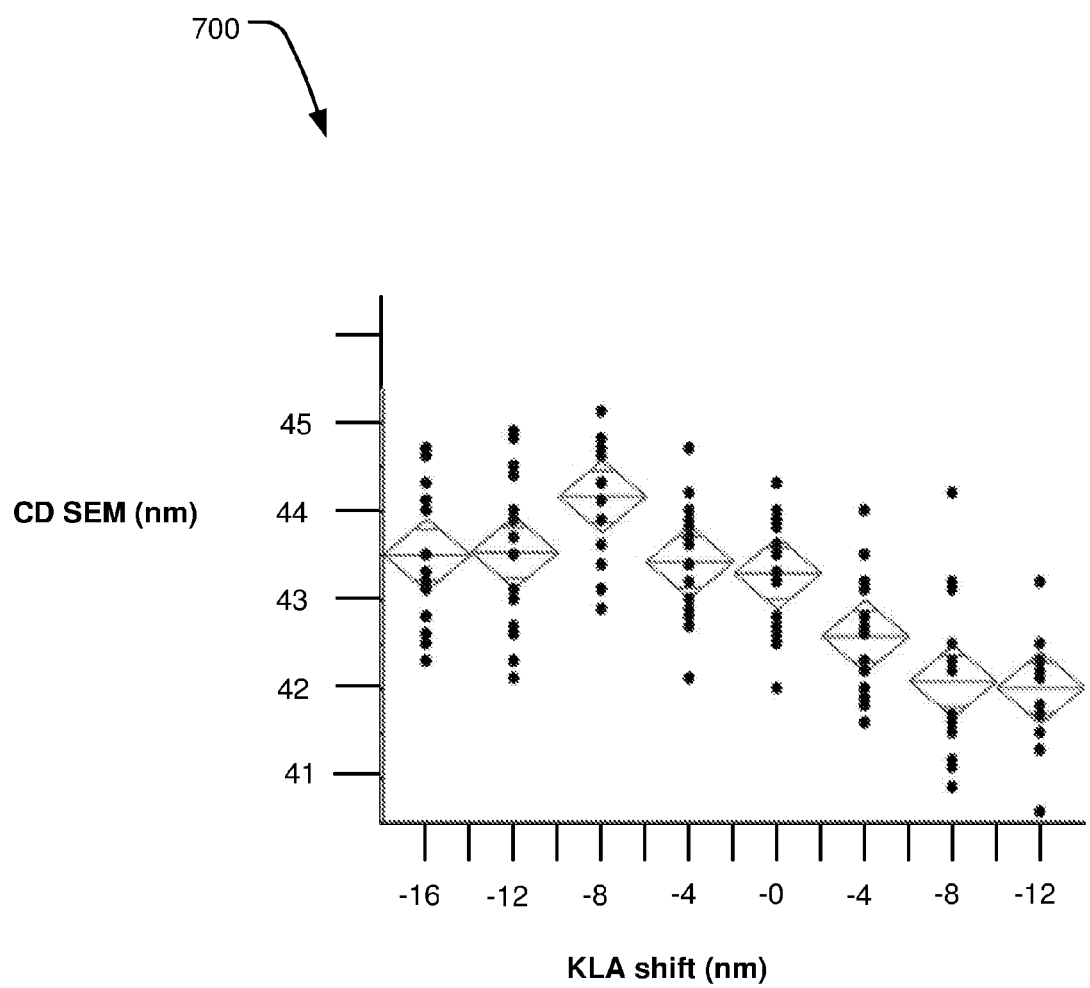
FIG. 7 illustrates an example graph of one-way analysis of CD SEM by KLA.

In another implementation, wafers with $SiO_2$ (10 nm)/amorphous carbon (35 nm)/Ru (30 nm)/NiFe(100 nm)/AlTiC (substrate) can be exposed with the trim and Alt-PSM masks. As shown in example graph 700 in FIG. 7, CD SEM indicates that there is a maximum CD when shifting the trim mask relative to an Alt-PSM by approximately −8 nm. The data shows wafer to wafer (wTw) and within wafer (wIw) sigma improvement over an implementation where there is zero offset between an Alt-PSM and a trim mask. The statistic data illustrates wTw sigma improves from 0.62 nm to 0.53 nm by shifting the trim mask relative to the Alt-PSM.

Figure 8:
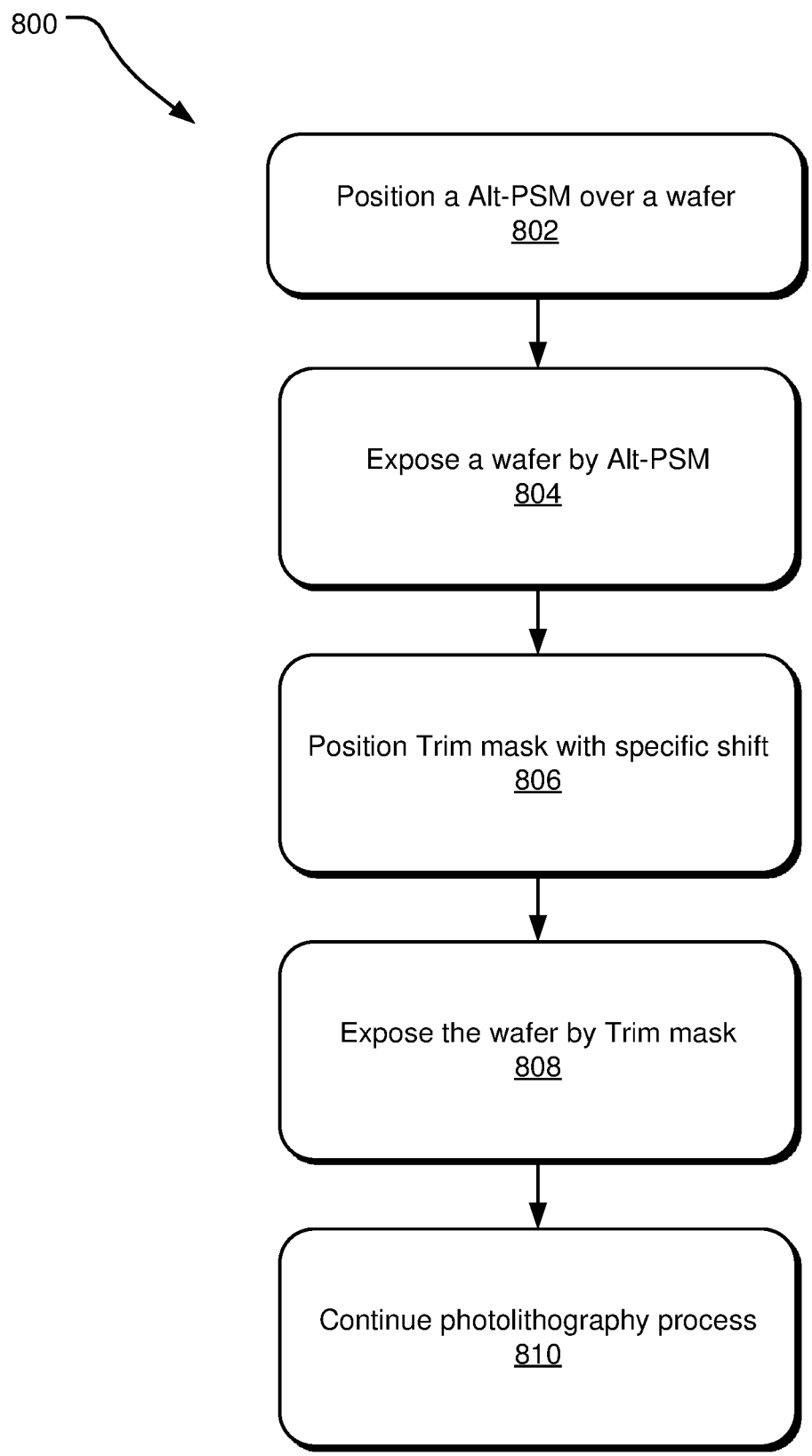
FIG. 8 illustrates example operations of exposing an Alt-PSM and a trim mask.

FIG. 8 illustrates example operations 800 of exposing an Alt-PSM and a trim mask. An Alt-PSM is positioned over a wafer in a positioning operation 802. An exposing operation 804 exposes a wafer by Alt-PSM. A trim mask is then positioned with specific shift in an operation 806. Specifically, operation 806 shifts the center placement of the trim mask relative to a phase transition edge of the Alt-PSM.

The trim mask can be shifted relative to the Alt-PSM for various measurements. In one implementation, the trim mask relative to the Alt-PSM can be shifted by at least 2 nm. In other implementations, the trim mask relative to the Alt-PSM can be shifted even more. The shift between the trim mask and the Alt-PSM is a function of trim mask CAD size and a dose ratio between of a trim mask and an Alt-PSM. An operation 808 exposes the same wafer through a trim mask. The wafer with double exposures continues through the normal photolithography process in an operation 810.

Figure 9:
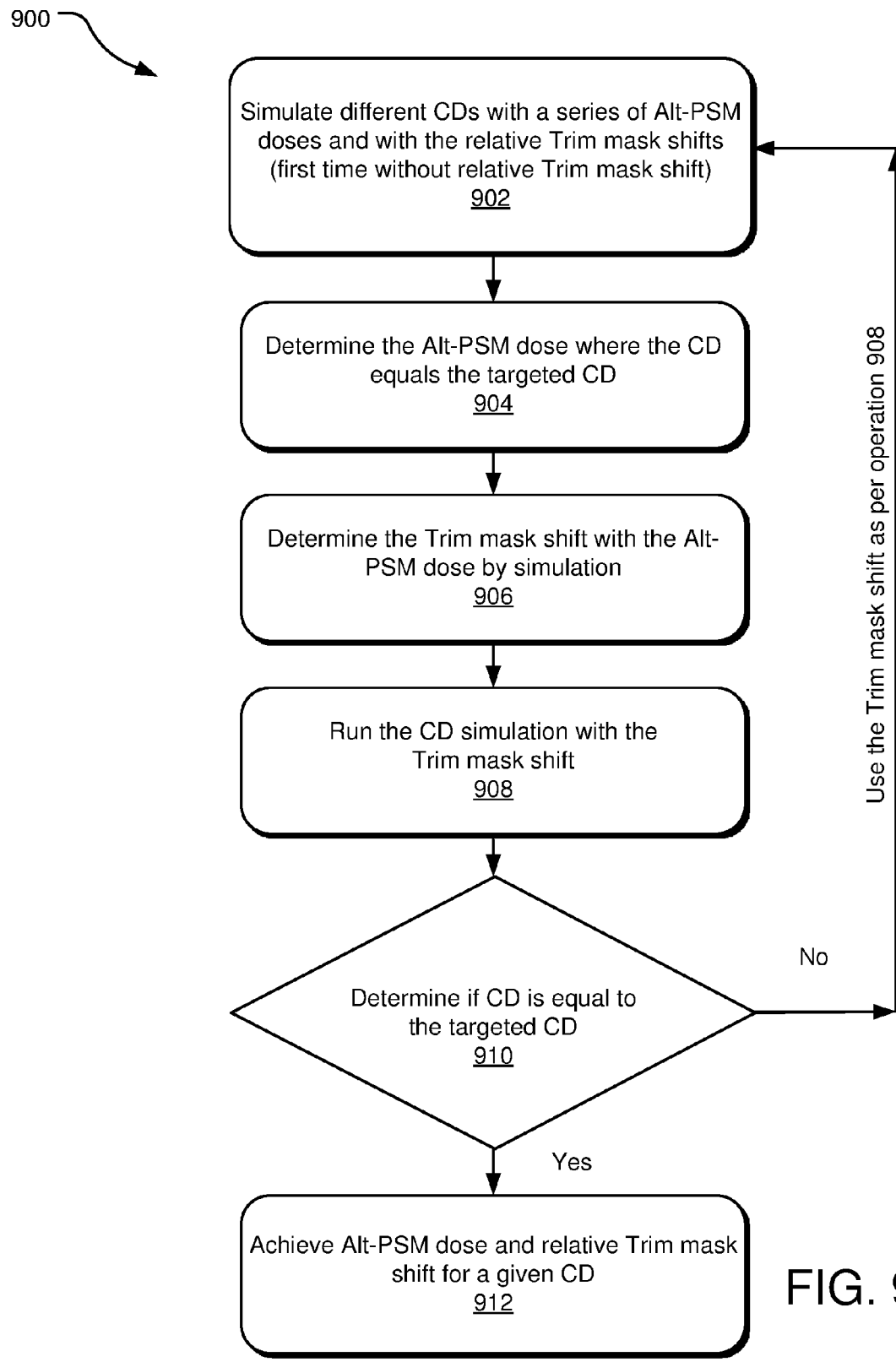
FIG. 9 illustrates example operations for optimizing an Alt-PSM dose and relative trim mask shift for a given CD.

FIG. 9 illustrates example operations 900 for optimizing the process conditions such as trim mask relative shift and Alt-PSM dose for a targeted CD. In this implementation, all process parameters are constant, including the trim mask dose for illustrative purposes. The trim mask dose can be chosen independently.

A simulation operation 902 simulates different CDs with a series of Alt-PSM exposure dose ($mJ/cm^2$) settings and with the relative trim mask shifts. The first time the simulation operation 902 is performed, the simulation operation 902 is performed without relative trim mask shift.

In an operation of 904, the Alt-PSM exposure dose can be drawn based on a working function of CD vs. Alt-PSM dose. The exposure dose determined at operation 904 is then fed to the operation 906. In operation 906, the trim mask shift can be determined where the CD is maximized when sweeping the shift with Alt-PSM dose.

The CD simulation is then run with the trim mask shift in an operation 908. A determining operation 910 determines whether the CD is equal to the targeted CD. If the CD is equal to the targeted CD, then an Alt-PSM dose and relative trim mask shift for a given CD is achieved in an operation 912. If the CD is not equal to the targeted CD, then the trim mask shift is used as per operation 908, operations 900 are repeated, starting with operation 902.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A method of photolithography, comprising:
exposing a wafer using an alternating phase shift mask (Alt-PSM) and a trim mask, wherein a center of the trim mask is shifted relative to a center of the alternating phase shift mask.

2. The method of claim 1, further comprising shifting the center of the trim mask compared to a phase transition edge of the Alt-PSM.

3. The method of claim 2, wherein the phase of the Alt-PSM changes from 180° to 0° at the phase transition edge of the Alt-PSM.

4. The method of claim 2, wherein the center of the trim mask is shifted compared to the phase transition edge of the Alt-PSM by at least 2 nm.

5. The method of claim 2, wherein the center of the trim mask is shifted compared to the phase transition edge of the Alt-PSM by approximately 8 nm.

6. The method of claim 2, further comprising iteratively determining a combination of Alt-PSM exposure dose and a shift between the trim mask and the Alt-PSM to generate a target critical dimension.

7. The method of claim 3, wherein the trim mask has a width of approximately 200 nm.

8. The method of claim 1, further comprising using chrome on the trim mask, wherein a size of chrome area is less than 500 nm.

9. A method of photolithography, comprising:
exposing a wafer using an alternating phase shift mask (Alt-PSM) and a trim mask, wherein an exposure placement of the trim mask is shifted relative to an exposure placement of the Alt-PSM.

10. The method of claim 9, further comprising shifting a center of the trim mask compared to a phase transition edge of the Alt-PSM.

11. The method of claim 10, further comprising shifting a center of the trim mask compared to the phase transition edge of the Alt-PSM by at least 2 nm.

12. The method of claim 10, further comprising shifting the center of the trim mask compared to the phase transition edge of the Alt-PSM by approximately 8 nm.

13. The method of claim 9, wherein a width of the trim mask is approximately 200 nm.

14. The method of claim 9, wherein a width of the trim mask is less than 500 nm.

15. A method of photolithography comprising:
simulating different critical dimensions with a series of alternating phase shift mask (Alt-PSM) exposure doses and relative trim mask shifts;
determining a first Alt-PSM exposure dose;
determining a first trim mask shift with the first Alt-PSM exposure dose; and
simulating a first critical dimension with the trim mask shift.

16. The method of claim 15, wherein determining the first Alt-PSM exposure dose is based on a function of critical dimension vs. Alt-PSM dose.

17. The method of claim 15, wherein determining the trim mask shift is based on where the first critical dimension is maximized when sweeping the shift with the first Alt-PSM dose.

18. The method of claim 15, further comprising determining whether the first critical dimension is equal to a targeted critical dimension.

19. The method of claim 18, wherein an Alt-PSM dose and relative trim mask shift for the first critical dimension is achieved if the first critical dimension is equal to the targeted critical dimension.

20. The method of claim 18, further comprising repeating the simulating different critical dimensions with a series of Alt-PSM exposure doses and relative trim mask shifts operations if the critical dimension is not equal to the targeted critical dimension.

* * * * *